(12) United States Patent
Chang

(10) Patent No.: US 6,423,147 B1
(45) Date of Patent: Jul. 23, 2002

(54) METHOD OF CLEANING A WAFER

(75) Inventor: Ching-Yu Chang, I Lan Hsien (TW)

(73) Assignee: Macronix International Co. Ltd., Hsin-Chu (TW)

(*) Notice: Subject to any disclaimer, the term of this patent is extended or adjusted under 35 U.S.C. 154(b) by 0 days.

(21) Appl. No.: 09/682,134

(22) Filed: Jul. 26, 2001

(30) Foreign Application Priority Data

Aug. 17, 2000 (TW) .......................... 089116592 A

(51) Int. Cl.$^7$ ............................. B08B 3/00; B08B 3/10
(52) U.S. Cl. ............................. 134/2; 134/3; 134/18; 134/902
(58) Field of Search .................. 134/2, 3, 18, 902

(56) References Cited

U.S. PATENT DOCUMENTS 4,910,578 A * 3/1990 Okamoto .................. 357/71
5,516,730 A * 5/1996 Saeed et al. ................. 437/235

* cited by examiner

Primary Examiner—Zeinab El-Arini
(74) Attorney, Agent, or Firm—Winston Hsu

(57) ABSTRACT

A method of removing small particles remaining on a surface of a semiconductor wafer and preventing a silicide layer covering the semiconductor wafer from corroding starts by controlling a temperature of the semiconductor wafer to between room temperature and 45° C. Then, a cleaning solution of a temperature between 0° C. and 45° C. is utilized to clean the semiconductor wafer to effectively remove small particles remaining on the surface of the semiconductor wafer and prevent the silicide layer from corrosion by the cleaning solution. Therein, the cleaning solution is comprised of a pre-determined volume ratio of hydrogen peroxide ($H_2O_2$), ammonia ($NH_4OH$), and deionized water.

4 Claims, 3 Drawing Sheets

METHOD OF CLEANING A WAFER

FIELD OF THE INVENTION

The present invention relates to a method of cleaning a surface of a semiconductor wafer, and more particularly, to a method of effectively removing small particles on the surface of the semiconductor wafer and preventing a silicide layer on the semiconductor wafer from corroding.

BACKGROUND OF THE INVENTION

A metal-oxide-semiconductor field effect transistor (MOSFET) is a very important device in integrated circuits. Electrical performance of a gate in the MOSFET is a critical factor influencing quality of the MOSFET:

The gate generally comprises a gate oxide layer, a polysilicon layer and a silicide layer. The silicide layer can be formed by utilizing a traditional chemical vapor deposition method or a self-aligned silicide method. After completing an etching process to define a gate on a surface of a silicon substrate, a cleaning process is performed to remove contaminants, such as organics, small particles or heavy metals, on the surface of the semiconductor wafer. As a result, the cleaning process can prevent those contaminants from reducing the electrical performance of the gate or quality control of semiconductor fabrication.

SC-1 solution is the most commonly used solution for removing contaminants on the surface of the semiconductor wafer. It is mainly comprised of hydrogen peroxide ($H_2O_2$) and ammonia ($NH_4OH$). A prior art cleaning method of removing small particles on the surface of the semiconductor wafer is disclosed in U.S. Pat. No. 5,516,730, proposed by Pirooz et al. In the cleaning method of U.S. Pat. No. 5,516,730, a semiconductor wafer is immersed in a traditional SC-1 solution to remove organics and small particles. Further, heavy metals remaining on the surface of the semiconductor wafer form soluble complexes in the SC-1 solution. The cleaning process mentioned above is usually performed at a temperature exceeding 50° C. Then, a solution containing a mixture of hydrofluoric acid and hydrochloric acid is utilized to moisten and rinse the semiconductor wafer. After that, deionized water is utilized to immerse the surface of the semiconductor wafer. Finally, an ozonated water is utilized to touch the surface of the semiconductor wafer.

However, the cleaning method proposed by Pirooz, et al. is not suitable for a semiconductor wafer covered by a silicide layer because SC-1 solution would seriously corrode the silicide layer on the semiconductor wafer. For example, a rate of silicide layer corrosion due to SC-1 solution exceeds 24 Å/min at a temperature of 70° C. The corrosion of the suicide layer leads to insufficient thickness of the silicide layer after many repetitions of cleaning processes. As a result, a Caros solution cleaning process is performed to clean the surface of the semiconductor wafer covered by the silicide layer.

The Caros solution cleaning process utilizes a sulfuric acid solution, whose volume ratio of sulfuric acid to water is about 5 to 1, to clean the surface of the semiconductor wafer at a temperature between 90° C. and 125° C. Utilizing the Caros solution to clean the surface of the semiconductor wafer does not lead to corrosion of the silicide layer. However, an ability of the Caros solution to remove small particles on the semiconductor wafer has not met requirements of more stringent semiconductor fabrication.

SUMMARY OF INVENTION

It is therefore a primary objective of the present invention to provide a method of cleaning a surface of a semiconductor wafer. The method utilizes an SC-1 solution comprising hydrogen peroxide ($H_2O_2$) and ammonia ($NH_4OH$), and serving as a cleaning solution to remove small particles on the surface of the semiconductor wafer.

It is another objective of the present invention to provide a cleaning method that prevents a silicide layer of the semiconductor wafer from corroding. The method effectively removes small particles remaining on the surface of the semiconductor wafer to enhance a yield of semiconductor products.

In the method of the present invention, a temperature of the semiconductor wafer is controlled to between room temperature and 45° C. Then, a cleaning solution (SC-1), with a temperature between 0° C. and 45° C., is utilized to clean the semiconductor wafer to effectively remove small particles remaining on the surface of the semiconductor wafer. The cleaning solution (SC-1) comprises a predetermined volume ratio of hydrogen peroxide ($H_2O_2$), ammonia ($NH_4OH$), and deionized water.

It is an advantage of the present invention that it provides a method of utilizing SC-1 solution to clean a semiconductor wafer covered by a silicide layer. By controlling a temperature, the silicide layer on the surface of the semiconductor wafer is prevented from corrosion by the SC-1 solution and, therefore, a particle-free surface of the semiconductor wafer is obtained.

These and other objectives and advantages of the present invention will no doubt become obvious to those of ordinary skill in the art after having read the following detailed description of the preferred embodiment that is illustrated in the various figures and drawings.

DETAILED DESCRIPTION

Figure 1:
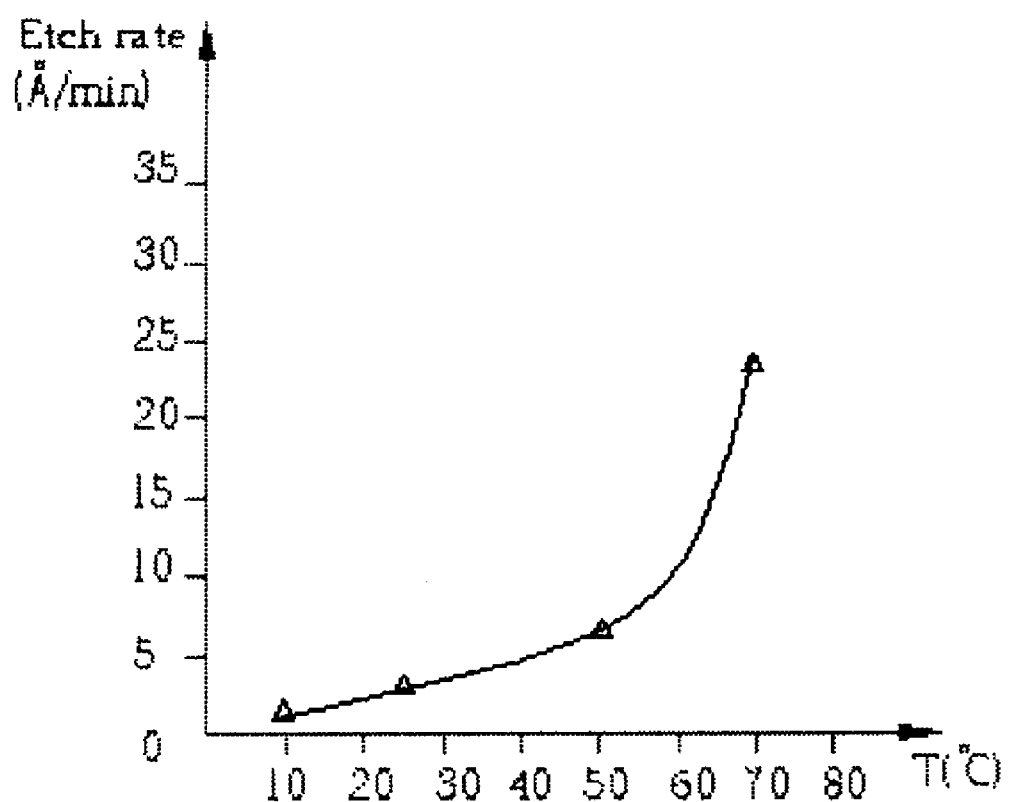
FIG. 1 is a schematic diagram of a relationship between temperature of SC-1 cleaning solution and corrosion rate of a suicide layer on a semiconductor wafer.

Please refer to FIG. 1. FIG. 1 is a schematic diagram of a relationship between a temperature of an SC-1 cleaning solution and a corrosion rate of a silicide layer on a semiconductor wafer. As shown in FIG. 1, a y-axis represents the corrosion rate of the silicide layer by the SC-1 cleaning solution, measured in Å/min. An x-axis represents the temperature of the SC-1 cleaning solution, measured in ° C. Noticeably, the temperature of the semiconductor wafer is the same as the temperature of the SC-1 solution.

As mentioned above, an operating temperature is between 50° C. and 70° C., or higher than 70° C., in general operating conditions in the SC-1 cleaning process. Use of the SC-1 cleaning solution leads to serious corrosion of the silicide layer. As a result, the prior art SC-1 solution cleaning process is not suitable for cleaning the semiconductor wafer covered by the suicide layer. As shown in FIG. 1, it is found that corrosion rate of the silicide layer decreases rapidly as the temperature of the surface of the semiconductor wafer and the temperature of the SC-1 cleaning solution both are cooled to room temperature (~25° C.). Further, as the temperature of the SC-1 cleaning solution is cooled to 10° C., the corrosion rate of a suicide layer is controlled to lower than 2 Å/min.

The method of the present invention is mainly applied on the semiconductor wafer 10 covered by the silicide layer 18.

Figure 2:
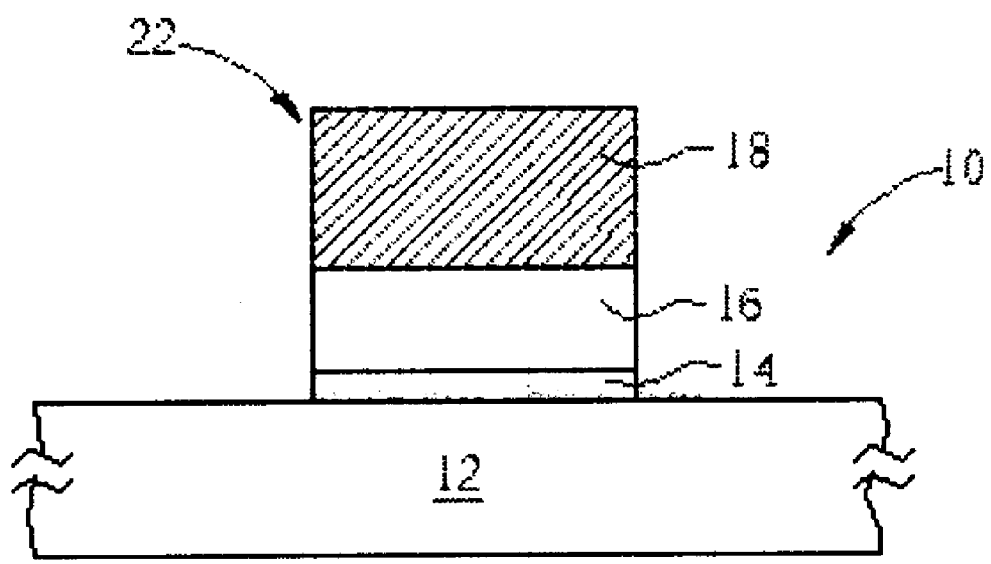
FIG. 2 is a schematic diagram of magnified portions of a surface of the semiconductor wafer.

Please refer to FIG. 2. FIG. 2 is a schematic diagram of magnified portions of the surface of the semiconductor wafer according to the present invention. As shown in FIG. 2, a silicon substrate 12 of the semiconductor wafer 10 comprises at least a defined gate 22. The gate 22 comprises a gate oxide layer 14, of a thickness about 100 Å, located on the silicon substrate 12, a polysilicon layer 16, of a thickness about 1000 Å, located on the gate oxide layer 14, and a metal silicide layer 18 composed of tungsten-polysilicide, of a thickness about 1500 Å, located on the polysilicon layer 16. The preferred embodiment of the present invention utilizes the semiconductor wafer 10 comprising the gate 22 to serve as an example to illustrate the present invention method. However, the present invention is not limited to the embodiment mentioned in this disclosure. The cleaning method of the present invention is suitable for any surface of a semiconductor wafer covered by a metal suicide layer composed of tungsten suicide or titanium silicide.

The method of the present invention is performed in a wet batch cleaning apparatus. The wet batch cleaning apparatus comprises a series of water tanks (not shown here). Every water tank may be filled with a different cleaning solution, such as an SC-1 solution, an SC-2 solution or deionized water, to perform a series of cleaning processes. More particularly, in the preferred embodiment of the present invention, a water tank filled with an SC-1 cleaning solution needs a constant temperature apparatus to exactly control the temperature of the SC-1 cleaning solution in the water tank at $T_2$. $T_2$ is controlled between 0° C. and 45° C. and a cooling liquid used to control $T_2$ could be ice water or liquid nitrogen.

Figure 3:
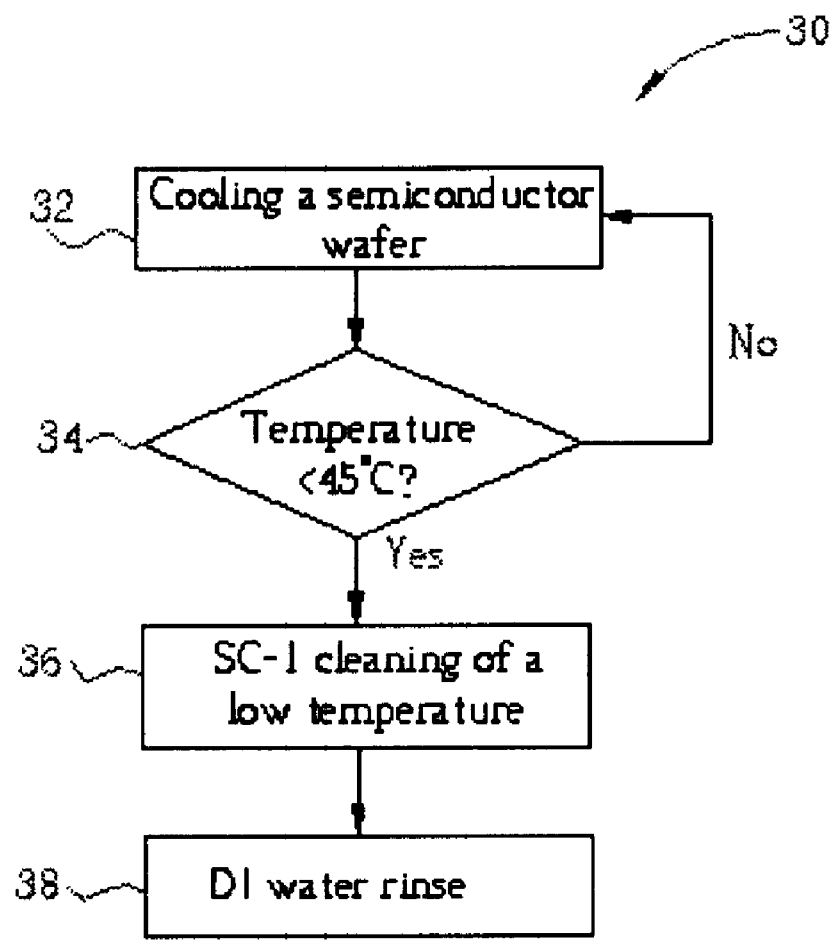
FIG. 3 is a flow chart of cleaning the semiconductor wafer.

Please refer to FIG. 3. FIG. 3 is a flow chart of cleaning the semiconductor wafer 10. As shown in FIG. 3, first performing step 32 cools the semiconductor wafer 10 to a temperature $T_1$, which is between room temperature and 45° C. A cooling time needed in step 32 depends on a process occurring before the cleaning process. Then, step 34 is performed. After confirming the temperature of the semiconductor wafer 10 to be lower than 45° C., optimal at room temperature or lower than room temperature, step 36 is performed. Noticeably, if the temperature of the semiconductor wafer 10 exceeds 45° C., step 32 must be repeated to cool the semiconductor wafer 10 until the temperature of the semiconductor wafer 10 is lower than 45° C. and is kept at a pre-determined temperature.

Then, step 36 is implemented to perform a low temperature SC-1 cleaning process. In the preferred embodiment of the present invention, the SC-1 cleaning solution is comprised of ammonium (NH4OH), hydrogen peroxide (H2O2) and deionized water. The volume ratio of ammonium, hydrogen peroxide, and deionized water of the cleaning solution is between 1:1:5 and 1:4:60 (ammonium: hydrogen peroxide: deionized water). In step 36, the semiconductor wafer 10 cooled to room temperature is immersed in the SC-1 cleaning solution at a controlled temperature of about 10° C. by a mechanical robot arm. An immersing time is between 3 and 10 minutes. Finally, step 38 is performed to immerse the semiconductor wafer 10 in a water tank filled with deionized water to rinse the surface of the semiconductor wafer 10.

Comparing with the prior art method of cleaning a surface of a semiconductor wafer, the cleaning solution in the wet cleaning process of the present invention is comprised of ammonium (NH4OH), hydrogen peroxide (H2O2) and deionized water. The volume ratio of ammonium, hydrogen peroxide, and deionized water of the cleaning solution is between 1:1:5 and 1:4:60 (ammonium: hydrogen peroxide: deionized water). The method of the present invention is to control the temperature of the semiconductor wafer and SC-1 cleaning solution to a pre-determined low temperature ($T_1$ and $T_2$ respectively) and then, perform the wet cleaning process to remove small particles on the surface of the semiconductor wafer. As a result, the method of the present invention effectively removes small particles remaining on the surface of the semiconductor wafer covered by the silicide layer and prevents the suicide layer from over-corroding.

The above disclosure is based on the preferred embodiment of the present invention. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A cleaning method for preventing a silicide layer from corroding, the method comprising:

providing a wafer comprising a silicide layer formed on a surface of the wafer;

controlling a temperature of the wafer to be $T_1$;

preparing a cleaning solution containing ammonium, hydrogen peroxide, and deionized water;

controlling a temperature of the cleaning solution to be $T_2$; and thereafter contacting the wafer with the cleaning solution for a time period t;

wherein $T_1$ is between room temperature and 45° C., and $T_2$ is between 0° C. and 45° C. so as to facilitate the removal of small particles remaining on a surface of the silicide layer and prevent the silicide layer from corroding.

2. The method of claim 1 wherein a volume ratio of ammonium, hydrogen peroxide, and deionized water of the cleaning solution is between 1:1:5 to 1:4:60 (ammonium: hydrogen peroxide: deionized water).

3. The method of claim 1 wherein the silicide layer is composed of tungsten silicide or titanium silicide.

4. method of claim 1 wherein the time period t ranges from 3 minutes to 10 minutes.

* * * * *